United States Patent
Sim et al.

(10) Patent No.: US 10,038,451 B2
(45) Date of Patent: Jul. 31, 2018

(54) ALL DIGITAL PHASE LOCKED LOOP

(71) Applicants: SK hynix Inc., Icheon (KR); POSTECH ACADEMY-INDUSTRY FOUNDATION, Pohang (KR)

(72) Inventors: Jae Yoon Sim, Pohang (KR); Min Seob Lee, Pohang (KR); In Hwa Jung, Hwaseong (KR); Yong Ju Kim, Seoul (KR)

(73) Assignees: SK HYNIX INC., Icheon (KR); POSTECH ACADEMY-INDUSTRY FOUNDATION, Pohang (KR)

( * ) Notice: Subject to any disclaimer, the term of this patent is extended or adjusted under 35 U.S.C. 154(b) by 0 days.

(21) Appl. No.: 15/795,703

(22) Filed: Oct. 27, 2017

(65) Prior Publication Data

US 2018/0183447 A1 Jun. 28, 2018

(30) Foreign Application Priority Data

Dec. 26, 2016 (KR) ........................ 10-2016-0178753

(51) Int. Cl.
*H03L 7/099* (2006.01)
*H03L 7/07* (2006.01)

(52) U.S. Cl.
CPC .............. *H03L 7/0992* (2013.01); *H03L 7/07* (2013.01)

(58) Field of Classification Search
CPC .............................. H03L 7/091; H03L 7/0992
See application file for complete search history.

(56) References Cited

U.S. PATENT DOCUMENTS

| | | | |
|---|---|---|---|
| 8,502,575 B2* | 8/2013 | Zhang | H03L 7/1976 327/147 |
| 9,287,886 B2* | 3/2016 | Ciccarelli | H03L 7/1974 |
| 9,325,331 B2* | 4/2016 | Ainspan | H03L 7/0992 |
| 9,379,719 B1* | 6/2016 | Huang | H03L 7/085 |
| 2008/0315959 A1 | 12/2008 | Zhuang et al. | |

FOREIGN PATENT DOCUMENTS

KR  10-2016-0013945 A  2/2016

* cited by examiner

*Primary Examiner* — Hai L Nguyen

(57) ABSTRACT

An all digital phase locked loop (ADPLL) includes an integer part phase processing circuit that outputs an integer part frequency signal using a first value and a second value. The first value is obtained by counting edges of one of a plurality of output clock signals. The second value indicates current edge position information on an edge position of an external reference clock signal with respect to the plurality of output clock signals. The ADPLL further includes a fraction part phase processing circuit that selects two adjacent output clock signals of the plurality of output clock signals according to a prediction selection signal and that generates a fraction part frequency signal using the fraction part phase signal, the prediction selection signal being generated according to a fraction part phase signal indicating fraction part phase information and a signal indicating the current edge position information.

12 Claims, 11 Drawing Sheets

ALL DIGITAL PHASE LOCKED LOOP

CROSS-REFERENCE TO RELATED APPLICATION

This application claims priority under 35 U.S.C. § 119 to Korean Patent Application No. 10-2016-0178753 filed on Dec. 26, 2016 in the Korean Intellectual Property Office, the disclosure of which is incorporated herein by reference in its entirety.

TECHNICAL FIELD

Embodiments relate to an all digital phase locked loop used in a semiconductor device.

DISCUSSION OF THE RELATED ART

Recently, with the miniaturization, low power consumption, and multi-functionality of electronic appliances, semiconductor devices capable of storing information in various electronic appliances such as computers and portable communication devices have been more desirable, and research has been conducted for the semiconductor devices.

A clock signal required for input/output data synchronization of a Double Data Rate (DDR) Dynamic random-access memory (DRAM) used in such semiconductor devices has a frequency corresponding to a half of a data rate of the DDR DRAM and is input from an external device. A delay locked loop (DLL) in the DRAM receives such an external input clock signal and controls a delay time to generate a phase required for data synchronization. The DLL generates such a phase based on the frequency of the external input clock signal, when an open loop control method is used, fast phase locking is possible in a predetermined number of clock cycles. In addition, the DLL may be implemented with only one or more digital circuits. As a result, the DLL is widely used in the DRAM.

The fast phase locking indicates that a fast phase generation is possible in a predetermined number of clock cycles when an electronic system including the DLL transitions from a turn-off state to a turn-on state. This characteristic is useful in a power-down mode of such an electronic system and may be reduce power consumption of the electronic system in a waiting state.

However, as the DRAM data rate increases to several Gigabits per second (Gb/s), it becomes difficult to provide an external input signal with a high frequency required for the operation of the DLL in the DRAM. For example, in order to use the DLL in a high speed DRAM having a target data transmission rate of 10 Gb/s, a clock signal with a high frequency of 5 GHz should be input to the DLL. However, it is difficult to provide an external clock signal having the high frequency of 5 GHz.

Therefore, a phase locked loop (PLL), which receives an external input clock signal having a low input frequency instead of a high input frequency and generates an output clock signal having a high frequency required for data synchronization through a frequency multiplication operation, has become more desirable. A DRAM may include an All-Digital PLL (ADPLL). However, because the ADPLL has an oscillator that is not provided in the DLL, the ADPLL simultaneously detects a phase and a frequency of a signal output from the oscillator. As a result, a fast phase locking operation may be difficult.

SUMMARY

Various embodiments are directed to an all digital phase locked loop capable of reducing a number of counters by predicting current edge position information of an external reference clock and selecting an output clock, and capable of reducing a number of time to digital converters (TDCs).

In a first embodiment, an all digital phase locked loop (ADPLL) may include: a digitally-controlled oscillator (DCO) outputting a plurality of output clock signals, the plurality of output clock signals having different phases with respect to each other; an integer part phase processing circuit outputting an integer part frequency signal by using a first value and a second value, the first value being obtained by counting edges of one of the plurality of output clock signals, and the second value indicating current edge position information on an edge position of an external reference clock signal with respect to the plurality of output clock signals; a fraction part phase processing circuit selecting two adjacent output clocks of the plurality of output clock signals according to a prediction selection signal, the prediction selection signal being generated according to a fraction part phase signal indicating fraction part phase information of the external reference clock signal and a signal indicating the current edge position information, the fraction part phase processing circuit converting the two adjacent output clock signals into respective digital signals to generate the fraction part phase signal, and generating a fraction part frequency signal using the fraction part phase signal; and a frequency adding circuit adding the integer part frequency signal to the fraction part frequency signal, and outputting a frequency real word indicating frequencies of the plurality of output clock signals.

In a second embodiment, an all digital phase locked loop may include: a first subtractor subtracting a frequency real word from a frequency command word and outputting a frequency deviation signal; an integrator integrating the frequency deviation signal and outputting a phase deviation signal; a modulator modulating the phase deviation signal and outputting a digitally-controlled oscillator (DCO) driving signal; a DCO generating a plurality of output clock signals having different phases in response to the DCO driving signal; an integer part phase processing circuit outputting an integer part frequency signal by using a first value and a second value, the first value being obtained by counting edges of one of the plurality of output clock signals, and the second value indicating current edge position information on an edge position of an external reference clock signal with respect to the plurality of output clock signals; a fraction part phase processing circuit selecting two adjacent output clock signals of the plurality of output clock signals using a prediction selection signal, the prediction selection signal being generated according to a fraction part phase signal indicating fraction part phase information of the external reference clock signal and a signal indicating the current edge position information, the fraction part phase processing circuit converting the two adjacent output clock signals into respective digital signals to generate the fraction part phase signal, and generating the fraction part frequency signal using the fraction part phase information signal; and a frequency adding circuit adding the integer part frequency signal to the fraction part frequency signal, and outputting the frequency read word indicating frequencies of the plurality of output clock signals.

According to the all digital phase locked loop of the present invention, it is possible to process integer part phase information by using one rotational counter, so that it is possible to implement the all digital phase locked loop with low power.

Furthermore, according to the all digital phase locked loop of the present invention, it is possible to process fraction part phase information by using only two time to digital converters, so that it is possible to reduce unnecessary calculation.

DETAILED DESCRIPTION

Figure 1:
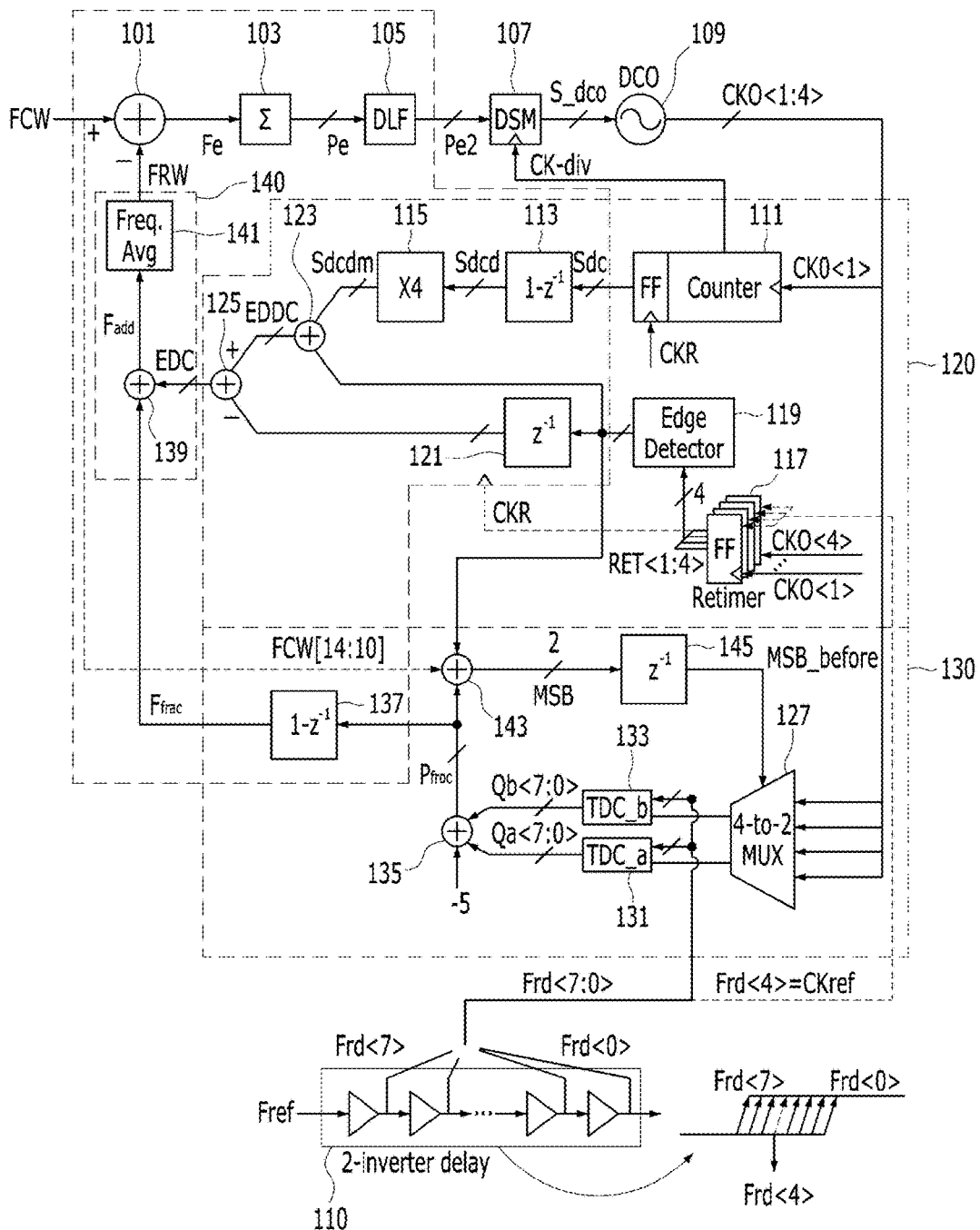
FIG. 1 is a block diagram of an ADPLL according to an embodiment.

Various embodiments will be described below in more detail with reference to the accompanying drawings. Embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

FIG. 1 is a block diagram of an ADPLL 100 according to an embodiment.

The ADPLL includes a first subtractor 101, an integrator 103, a digital loop filter (DLF) 105, a modulator 107, a digitally-controlled oscillator (DCO) 109, a reference frequency delay circuit 110, an integer part phase processing circuit 120, a fraction part phase processing circuit 130, and a frequency adding circuit 140.

The first subtractor 101 receives a frequency real word (FRW) from a frequency averaging part 141 and a frequency command word (FCW) from an external device. The first subtractor 101 subtracts a value of the FRW from a value of the FCW, and outputs a frequency deviation signal Fe indicating the subtracted value.

The integrator 103 integrates values of the frequency deviation signal Fe output from the first subtractor 101 in synchronization with an internal reference clock CKR, and outputs a digital phase deviation signal Pe.

The digital loop filter 105 integrates values of the digital phase deviation signal Pe output from the integrator 103 in synchronization with the internal reference clock CKR, and outputs a digital phase deviation integration signal Pe2.

The modulator 107 operates in synchronization with a divided clock CK_div, modulates the digital phase deviation integration signal Pe2 output from the digital loop filter 105, and generates a DCO driving signal S_dco.

The DCO 109 generates a plurality of output clocks CKO<1:4> having substantially the same oscillation frequency and different phases from each other according to the digital control oscillator driving signal S_dco. For example, an adjacent pair of (e.g., first and second output clock signals CKO<1> and CKO<2>) four output clocks CKO<1:4> have a phase difference corresponding to a 1/4 cycle time of each of the four output clock signals CKO<1:4>.

The reference frequency delay circuit 110 includes a plurality of delay elements serially and electrically coupled to one another, wherein the plurality of serially and electrically coupled delay elements may output a plurality of delayed reference frequency clocks Frd<N:0>, N being an integer, by using a reference frequency clock signal Fref applied from an external device and use any one of the plurality of delayed reference frequency clocks as an external reference clock signal CKref. A delay time of each of the plurality of delay elements in the reference frequency delay circuit 110 may correspond to a resolution of each of the first TDC 131 and the second TDC 133. In the embodiment shown in FIG. 1, first to eighth delayed reference frequency clocks Frd<7:0> are used as the plurality of delayed reference frequency clocks Frd<N:0> and the fifth delayed reference frequency clocks Frd<4> is used as the external reference clock CKref. In an embodiment, a multiplexer (not shown) is used to select one of the first to eighth delayed reference frequency clock signals Frd<0:7> as the external reference clock CKref.

The integer part phase processing circuit 120 includes a counter 111, a first differentiator 113, a multiplier 115, a retiming circuit 117, an edge detector 119, a first temporary storage circuit 121, a first adder 123, and a second subtractor 125.

Figure 2:
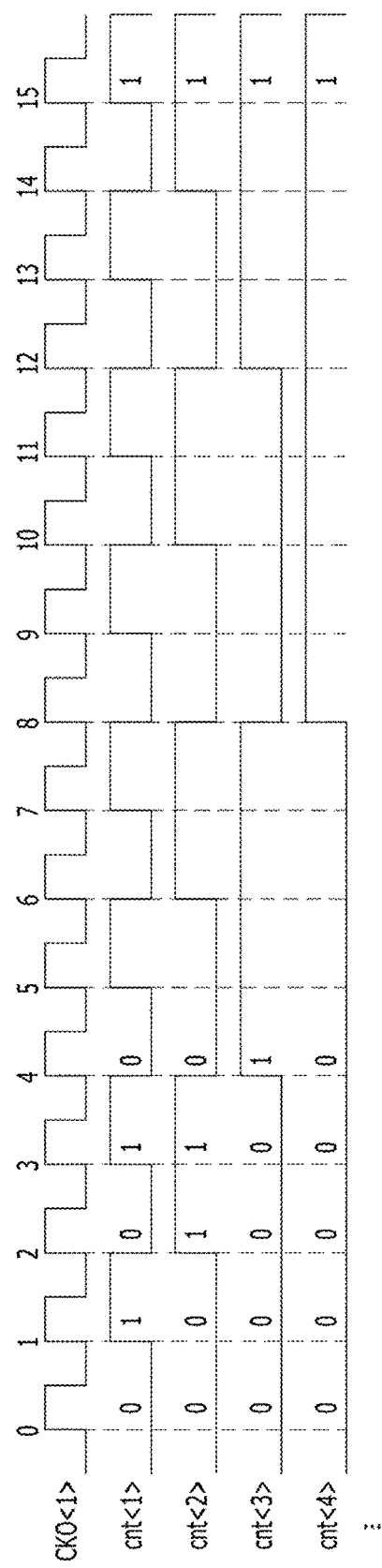
FIG. 2 is a timing diagram illustrating an operation of a counter according to an embodiment.

The counter 111 counts a rising edge of any one of the four output clocks CKO<1:4>, and outputs a digital count signal Sdc in synchronization with the internal reference clock signal CKR. For example, referring to FIG. 2, the counter 111 can digitize a phase of the first output clock signal CKO<1>. FIG. 2 is a timing diagram illustrating an operation of the counter 111 according to an embodiment. The counter 111 counts a number of rising edges of the first output clock CKO<1>, generates a 6 bit digital count signals cnt<6:1>, and outputs a signal indicating the number of the counted rising edges of the first output clock CKO<1> as the digital count signal Sdc to the first differentiator 113. In addition, the counter 111 outputs a second digital count signal cnt<2> of the 6 bit digital count signals cnt<6:1> as the divided clock signal CK_div to the modulator 107.

Referring back to FIG. 1, the first differentiator 113 differentiates the digital count signal Sdc having a 6-bit value, and outputs a digital count deviation signal Sdcd.

In the embodiment shown in FIG. 1 including the 4-phase DCO 109, the multiplier 115 multiplies the value of the 6-bit digital count deviation signal Sdc by four, and outputs a digital count deviation multiplication signal Sdcdm. However, embodiments of the present disclosure are not limited thereto, and a multiplication factor of the multiplier 115 may vary according to embodiments.

The retiming circuit 117 may cause the four output clocks (or the output clock signals) CKO<1:4> to synchronize with the external reference clock CKref, thereby generating first to fourth retiming clocks (or first to fourth retiming clock signals) RET<1:4>.

Figure 9:
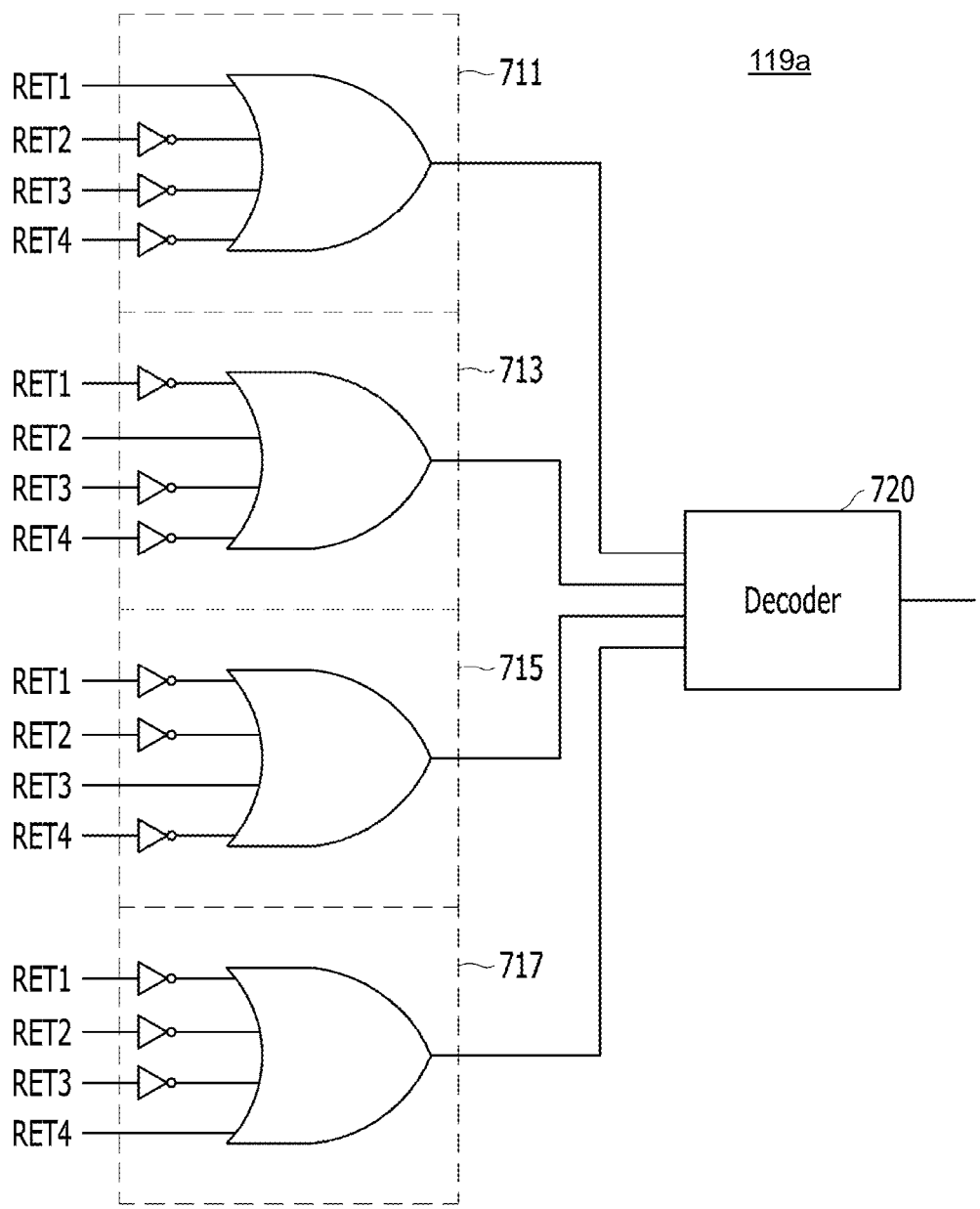
FIG. 9 is a circuit diagram of an edge detector of FIG. 1 according to an embodiment.

The edge detector 119 outputs a signal indicating current edge position information that has a 2-bit value by using a plurality of edge selectors (e.g., edge selectors 711, 713, 715, and 717 of FIG. 9) and a decoder (e.g., a decoder 720 of FIG. 9).

The first temporary storage circuit 121 temporarily stores the current edge position information, and outputs a signal indicating immediately previous edge position information in synchronization with the internal reference clock CKR.

The first adder 123 adds a value of the digital count deviation multiplication signal Sdcdm output from the multiplier 115 to the 2-bit value of the current edge position information output from the edge detector 119, and outputs a current edge position correction signal EDDC.

The second subtractor 125 subtracts a value of the signal indicating the immediately previous edge position information from a value of the current edge position correction information EDDC, and outputs an integer part frequency signal EDC.

The fraction part phase processing circuit 130 includes a multiplexer (e.g., a 4-to-2 MUX) 127, a first TDC 131, a second TDC 133, a third adder 135, a second differentiator 137, a second adder 143, and a second temporary storage circuit 145.

The second adder 143 adds a 5-bit value of a portion FCW[14:10] of the frequency command word FCW, a 3-bit value of a fraction part phase signal $P_{frac}$, and the 2-bit value of the signal indicating the current edge position information, and outputs a selection control signal MSB. For example, the second adder 143 adds the portion FCW[14:10] of the frequency command word FCW to the value of the fraction part phase signal $P_{frac}$, selects upper 2 bits, adds a value of the selected upper 2 bits to the value of the signal indicating the current edge position information, and then outputs the selection control signal MSB.

The second temporary storage circuit 145 temporarily stores a value of the selection control signal MSB and outputs an immediately previous selection control signal MSB_$_{before}$. The immediately previous selection control signal MSB_$_{before}$ indicates a value that had been most recently stored in the second temporary storage circuit 145 before the value of the selection control signal MSB is stored.

The multiplexer 127 selects and outputs two adjacent output clocks of the four output clocks CKO<1:4> by using the immediately previous selection control signal MSB_$_{before}$. For example, the multiplexer 127 selects one of the first and second output clock signals CKO<1> and CKO<2>, the second and third output clock signals CKO<2> and CKO<3>, the third and fourth output clock signals CKO<3> and CKO<4>, and the fourth and first output clock signals CKO<4> and CKO<1>, in response to the immediately previous selection control signal MSB_$_{before}$.

The first TDC 131 causes a preceding output clock signal of the two adjacent output clocks (e.g., the first output clock signal CKO<1> when the first and second output clock signals CKO<1> and CKO<2> are selected by the multiplexer 127) to synchronize with the first to eighth delayed reference frequency clocks Frd<7:0> output from the reference frequency delay circuit 110, and outputs a signal Qa<7:0> indicating phase information of the preceding output clock signal. For example, first to eighth bit values of the signal Qa<7:0> respectively correspond to values of the preceding output clock signal at times corresponding to rising edges of the first to eighth delayed reference frequency clocks Frd<7:0>.

The second TDC 133 causes a following output clock signal of the two adjacent output clocks (e.g., the second output clock signal CKO<2> when the first and second output clock signals CKO<1> and CKO<2> are selected by the multiplexer 127) to synchronize with the first to eighth delayed reference frequency clocks Frd<7:0>, and outputs a signal Qb<7:0> indicating phase information of the following output clock signal.

The third adder 135 adds a predetermined offset value (e.g., −5), a value of the signal Qa<7:0> indicating the phase information of the preceding output clock signal, and a value of the signal Qb<7:0> indicating the phase information of the following output clock signal, and outputs the fraction part phase signal Pfrac. In the embodiment shown in FIG. 1 including the first and second TDCs 131 and 133, the third adder 135 adds the predetermined offset value of −5 to make a minimum value of the fraction part phase signal Pfrac equal to zero when the fifth delayed reference frequency clock signal Frd<4> is the external reference clock signal CKref. However, embodiments of the present disclosure are not limited thereto, and the predetermined offset value may vary according to embodiments.

The second differentiator 137 differentiates the fraction part phase signal Pfrac and outputs a fraction part frequency signal Ffrac.

The frequency adding circuit 140 may include an adder 139, which adds the value of the integer part frequency signal EDC to a value of the fraction part frequency signal Ffrac and outputs an added frequency signal Fadd. The frequency adding circuit 140 may further include the frequency averaging circuit 141, which divides a value of the added frequency signal Fadd by the number (e.g., 4) of the output clock signals CKO<1:4> output from the DCO 109 so as to calculate an average value, and outputs the frequency real word FRW indicating the average value.

The adder 139 adds the value of the integer part frequency signal EDC to the value of the fraction part frequency signal Ffrac and outputs the added frequency signal Fadd.

According to the embodiment shown in FIG. 1, the edge detector 119 outputs the signal having a 2-bit value that indicates the current edge position information of the external reference clock CKref at a current cycle. As a result, it is possible to use a single counter, rather than four counters respectively receiving the four output clock signals CKO<1:4>, when the DCO 109 generates the four output clock signals CKO<1:4> to increase a resolution of phase detection by four times. Furthermore, it is also possible to predict next edge position information at a next cycle of the external reference clock CKref based on the current edge position of the external reference clock CKref, the fraction part phase signal Pfrac at the current cycle, and a fractional part of the frequency command word FCW, as will be described below with reference to FIG. 5. Because the next edge position information of the external reference clock CKref can be predicted, the ADPLL 100 can use two TDCs, rather than four TDCs, in order to generate the fraction part phase signal Pfrac at the next cycle. Consequently, it is possible to significantly reduce power consumption in the ADPLL 100 according to the embodiment, compared to the conventional ADPLL including four counters and four TDCs.

Figure 3:
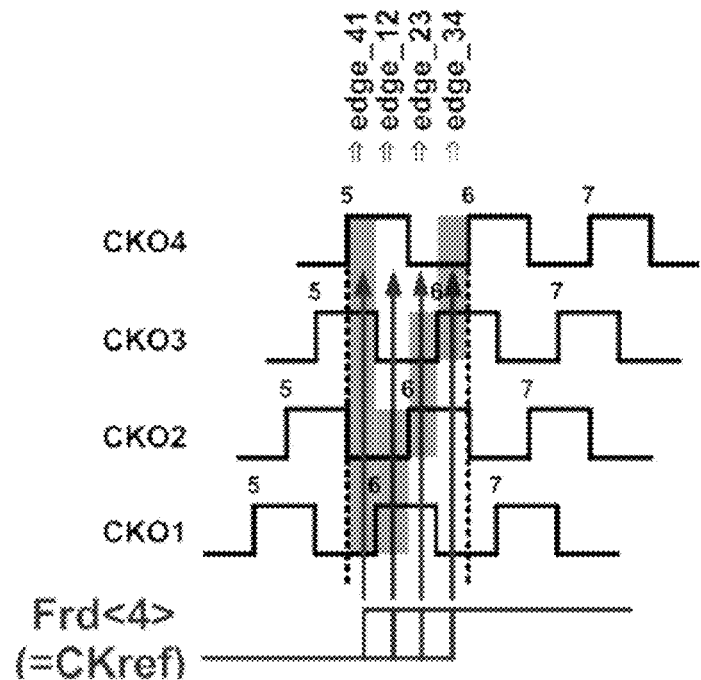
FIG. 3 illustrates an operation of processing integer part phase information according to an embodiment.

FIG. 3 illustrates an operation of processing of integer part phase information according to an embodiment.

When a rising edge of the external reference clock CKref is positioned at a third edge position edge_23 between a rising edge of the second output clock signal CKO2 and a rising edge of a third output clock signal CKO3, numbers of rising edges of the first to fourth output clock signals CKO1 to CKO4 is 6, 6, 5, and 5, respectively, as illustrated in FIG. 3. Using the four output clock signals CKO1 to CKO4, it is possible to calculate integer part phase information (e.g., the numbers of counted rising edges) with a resolution increased by four times, compared to when a single output clock signal is used.

Table 1 below shows values of the integer part phase information of the first to the fourth output clock signals CKO1 to CKO4 with respect to the external reference clock signal CKref, according to first to fourth edge positions edge_41 to edge 34 of a rising edge of the external reference clock signal CKref.

TABLE 1

| | Position of rising edge of external reference clock | | | |
|---|---|---|---|---|
| Phase | edge_41 | edge_12 | edge_23 | edge_34 |
| Rv_4 | n | n | n | n |
| Rv_3 | n | n | n | n + 1 |
| Rv_2 | n | n | n + 1 | n + 1 |
| Rv_1 | n | n + 1 | n + 1 | n + 1 |

In Table 1 above, Rv denotes results obtained by detecting the integer part phase information of the respective output clock signals CKO1 to CKO4 having different phases with respect to the external reference clock CKref.

The position of the rising edge of the external reference clock CKref may be divided into four cases as illustrated in FIG. 3. A first case in which the rising edge of the external reference clock CKref is positioned between rising edges of the adjacent fourth and first output clocks CKO4 and CKO1 is expressed to be positioned at the first edge position edge_41. A second case in which the rising edge of the external reference clock CKref is positioned between the rising edges of the adjacent first and second output clocks CKO1 and CKO2 is expressed to be positioned at the second edge position edge_12. A third case in which the rising edge of the external reference clock CKref is positioned between the rising edges of the adjacent second and third output clocks CKO2 and CKO3 is expressed to be positioned at the third edge position edge_23. A fourth case in which the rising edge of the external reference clock CKref is positioned between the rising edges of the adjacent third and fourth output clocks CKO3 and CKO4 is expressed to be positioned at the fourth edge position edge_34.

When an edge detector (e.g., the edge detector 119 of FIG. 1) provides current edge information indicating one of the first to fourth edge positions edge_41 to edge_34 and a single counter (e.g., the counter 111 of FIG. 1) provides a number of counted rising edges of one (e.g., CKO<1> of FIG. 1) of four output clock signals, other numbers of rising edges of the remaining output clock signals (e.g., CKO<2: 4> of FIG. 1) can be calculated using Table 2. As a result, an ADPLL (e.g., the ADPLL 100 of FIG. 1) using four output clock signals (e.g., CKO<1:4> of FIG. 1) according to an embodiment may include a single counter counting edges of one of the four output clock signals, rather than four counters respectively counting rising edges of the four output clock signals.

Figure 4:
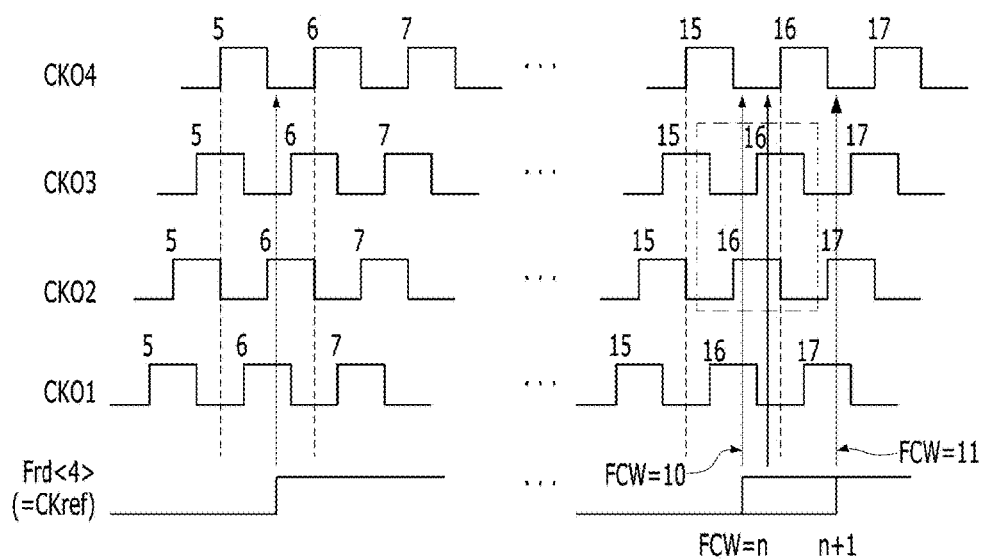
FIG. 4 illustrates an operation of processing fraction part phase information according to an embodiment.

FIG. 4 illustrates an operation of processing fraction part phase information according to an embodiment.

When the frequency command word (FCW) has an integer value, a relative position of a rising edge of the external reference clock CKref with respect to the first to fourth output clock signals CKO1 to CKO4 remains substantially the same for each cycle. However, when the frequency command word (FCW) has a non-integer value, the relative position of the rising edge of the external reference clock CKref changes for each cycle. That is, the relative position of the rising edge of the external reference clock CKref is related to a non-integer part (or a fractional part) after the decimal point of the frequency command word (FCW).

Referring to FIG. 4, in a current cycle, a rising edge of the external reference clock CKref is positioned between rising edges of the adjacent second and third output clocks CKO2 and CKO3. In the current cycle, a number of rising edges of the second output clock signal CKO2 is 6 and a number of rising edges of the third output clock signal CKO3 is 5.

When the frequency command word (FCW) has an integer value of 10, a rising edge of the external reference clock CKref in a next cycle is positioned at substantially the same phase with respect to the first to fourth output clock signals CKO1 to CKO4 as that of the current cycle, as indicated by a first arrow FCW=10 in FIG. 4. In this case, a number of rising edges of the second output clock signal CKO2 is 16 and a number of rising edges of the third output clock signal CKO3 is 15.

Similarly, when the frequency command word (FCW) has an integer value of 11, a rising edge of the external reference clock CKref in a next cycle is positioned at substantially the same phase as that of the current cycle, as indicated by a second arrow FCW=11 in FIG. 4. In this case, a number of rising edges of the second output clock signal CKO2 is 17 and a number of rising edges of the third output clock signal CKO3 is 16.

However, when the frequency command word (FCW) has a decimal value, for example, 10.**, a rising edge of the external reference clock CKref is positioned between the first and second arrows FCW=10 and FCW=11 in FIG. 4.

Figure 5:
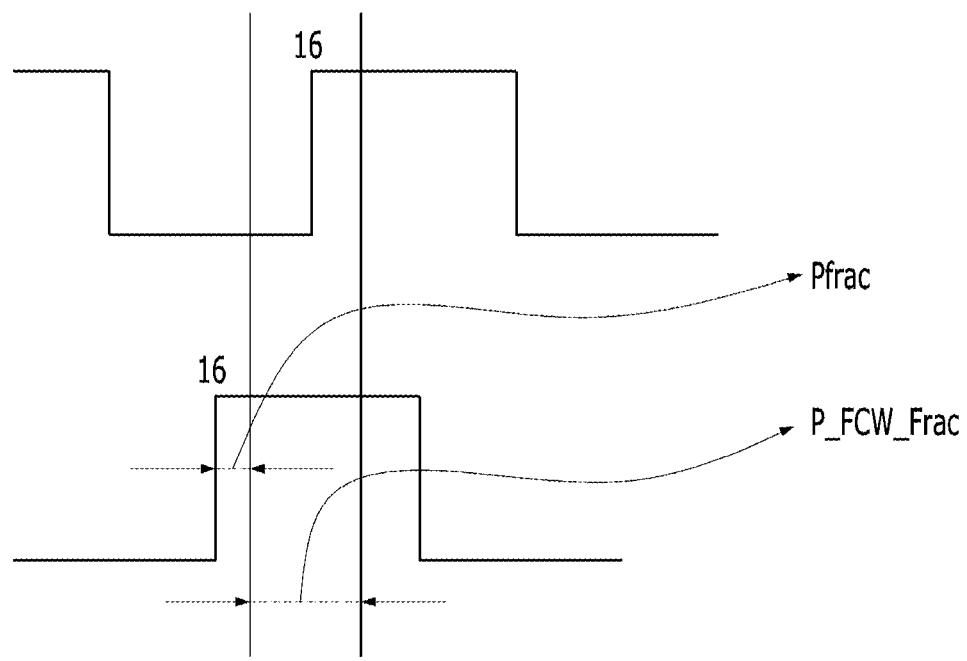
FIG. 5 is an enlarged view of a portion of a timing diagram of FIG. 4.

FIG. 5 is an enlarged view of a portion indicated by a dotted box in FIG. 4.

When the frequency command word (FCW) had an integer value, a phase FCW P_FCW_frac corresponding to a fractional part of the value of the FCW would be zero and a phase Pfrac of the external clock signal CKref corresponding to a fraction part phase signal (e.g., the fraction part phase signal Pfrac of FIG. 1) would remain substantially the same with respect to each of the second and third output clock signals CKO2 and CKO3. When the FCW has a non-integer value (e.g. 10.3), the phase FCW P_FCW_frac corresponds to the fractional part (e.g., 0.3) of the non-integer value obtained by subtracting the integer part (e.g., 10) from the non-integer value of the FCW).

Next edge position information may be predicted using current edge position information and the sum of the phases Pfrac and P_FCW_Frac at a current cycle, as indicated by Table 2 below.

TABLE 2

|  |  | current cycle | edge_41 | edge_12 | edge_23 | edge_34 |
|---|---|---|---|---|---|---|
| Pfrac + | 0.00~0.25 | Next cycle | edge_41 | edge_12 | edge_23 | edge_34 |
| P_FCW_Frac | 0.25~0.50 |  | edge_12 | edge_23 | edge_34 | edge_41 |
|  | 0.50~0.75 |  | edge_23 | edge_34 | edge_41 | edge_12 |
|  | 0.75~1.00 |  | edge_34 | edge_41 | edge_12 | edge_23 |
|  | 1.00~1.22 |  | edge_41 | edge_12 | edge_23 | edge_34 |

Because the next edge position information (e.g., the fourth edge position edge_34 of FIG. 3) of the external reference clock CKref can be predicted, a MUX (e.g., the MUX 127 of FIG. 1) can select a pair of adjacent output clocks signals (e.g., the third and fourth output clock signals CKO3 and CKO4 of FIG. 3) at the next cycle, instead of detecting the next edge position information using four output clock signals (e.g., the first to fourth output clock signals CKO1 to CKO4 of FIG. 3). Because an ADPLL (e.g., the ADPLL 100 of FIG. 1) according to an embodiment uses two adjacent output clock signals rather than four output clock signals, such an ADPLL can include two TDCs, rather than four TDCs.

Figure 6:
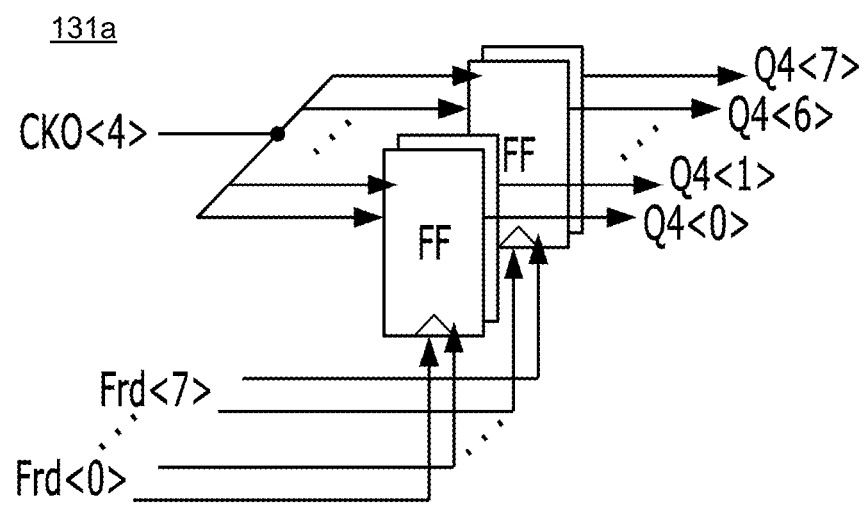
FIG. 6 is a circuit diagram of a TDC of FIG. 1 according to an embodiment.
Figure 7:
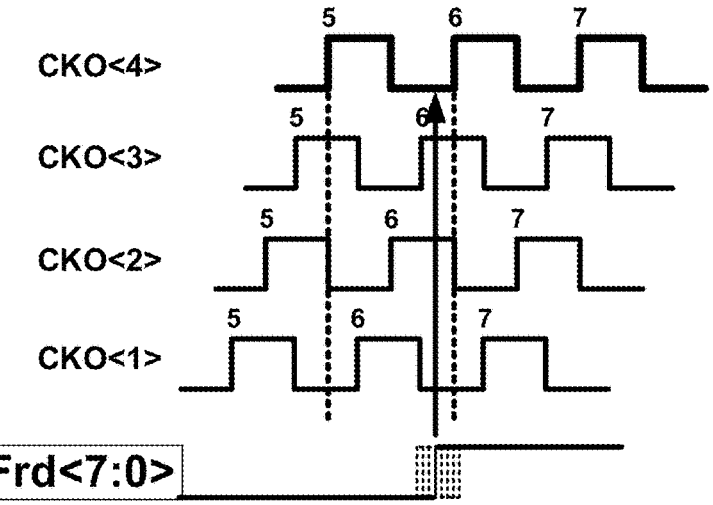
FIG. 7 illustrates waveforms of delayed reference frequency signals and output clock signals.

FIG. 6 is a circuit diagram of a TDC 131a suitable for use as the first or second TDC 131 or 133 of FIG. 1 according to an embodiment. FIG. 7 illustrates waveforms of the delayed reference frequency signals Frd<0> to Frd <7> and the output clock signals CKO<1> to CKO<4> of FIG. 1.

The TDC 131a outputs a plurality of digital code signals Q4<7:0> by using a plurality of flip-flops, which are electrically coupled in parallel to one another. The TDC 131a converts any one (e.g., the fourth output clock signal CKO<4>) of the four output clocks into the plurality of digital code signals Q4<7:0> respectively in synchronization with the first to eighth delayed reference frequency clocks Frd<7:0>.

FIG. 7 illustrates waveforms of delayed reference frequency signals Fr<7:0> and output clock signals CKO<1> to CKO<4>. Referring to FIG. 7, each of the output clocks CKO<1> to CKO<4> has a frequency higher than a frequency of each of the reference frequency clocks Frd<7:0>.

Figure 8:
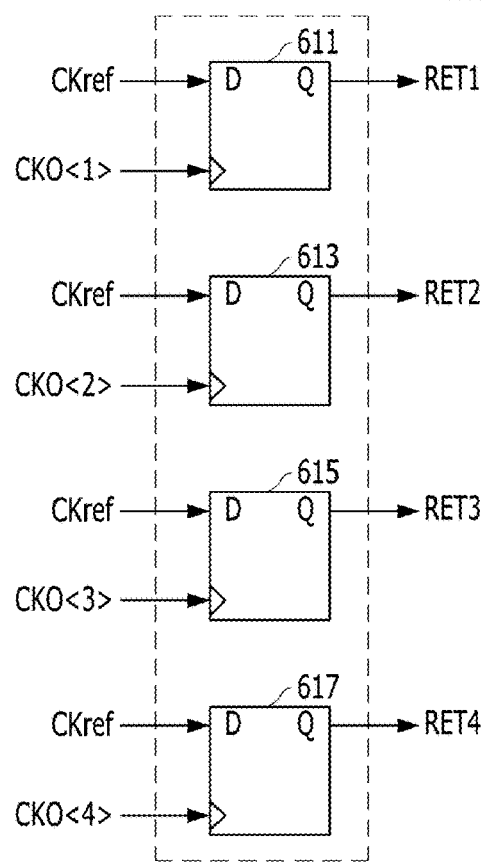
FIG. 8 is a circuit diagram of a retiming circuit of FIG. 1 according to an embodiment.

FIG. 8 is a circuit diagram of a retiming circuit 117a suitable for use as the retiming circuit 117 of FIG. 1 according to an embodiment.

The retiming circuit 117a includes a plurality of retimers 611, 613, 615, and 617, which synchronize the external reference clock CKref to the first to fourth output clocks CKO<1> to CKO<4> to generate first to fourth retiming clocks RET1 to RET4, respectively.

Each of the retimers 611, 613, 615, and 617 may include one or more flip-flops. For example, the first retimer 611 causes the external reference clock CKref to synchronize with the first output clock CKO<1>, thereby generating the first retiming clock RET1. The other retimers 613, 615, and 617 also operate in the same manner, thereby generating the second to fourth retiming clocks RET2 to RET4 having different phases, respectively. Any one of the first to fourth retiming clocks RET1 to RET4 may be used as the internal reference clock CKR.

FIG. 9 is a circuit diagram of an edge detector 119a suitable for use as the edge detector 119 of FIG. 1 according to an embodiment.

The edge detector 119a includes a plurality of edge selectors 711, 713, 715, and 717 and a decoder 720.

Each of the edge selectors 711, 713, 715, and 717 includes three inverters and one OR gate, receives the first to fourth retiming clocks RET1 to RET4, and outputs a signal having a logic high value according to the received first to fourth retiming clocks RET1 to RET4.

The decoder 720 outputs a signal indicating a value that varies according to output signals of the edge selectors 711, 713, 715, and 717 as indicated by Table 3 below.

TABLE 3

| Phase of CKref | Output of Decoder |
|---|---|
| edge_41 | 00 |
| edge_12 | 01 |
| edge_23 | 10 |
| edge_34 | 11 |

Figure 10:
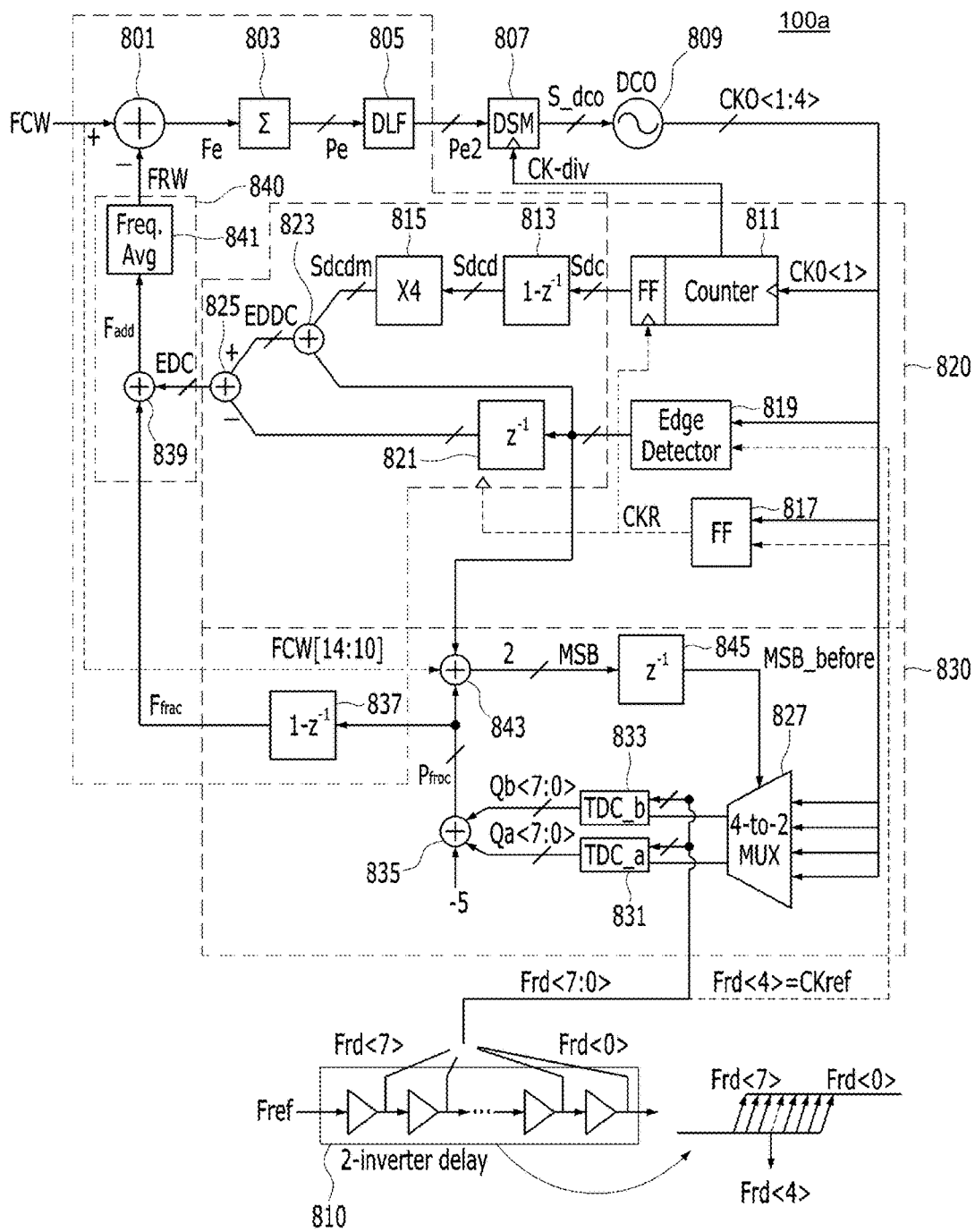
FIG. 10 is a block diagram of an ADPLL according to another embodiment.

FIG. 10 is a block diagram of an ADPLL 100a according to another embodiment.

The ADPLL 100a includes a first subtractor 801, an integrator 803, a digital loop filter (DLF) 805, a modulator (DSM) 807, a digital control oscillator 809, a reference frequency delay circuit 810, an integer part phase processing circuit 820, a fraction part phase processing circuit 830, and a frequency adding circuit 840.

The ADPLL 100a of FIG. 10 has substantially the same configuration as the ADPLL 100 of FIG. 1, except for a portion of the integer part phase processing circuit 820.

That is, in the ADPLL 100 of FIG. 1, the retiming circuit 117 uses four flip-flops, but in the ADPLL 100a of FIG. 10, a single flip-flop 817 is used and the internal reference clock CKR is generated using any one of the four output clocks CKO<1:4>. In an embodiment, any one of the four output clocks CKO<1:4> input to the flip-flop 817 corresponds to an output clock input to a counter 811.

In the ADPLL 100a, an edge detector 819 causes the four output clocks CKO<1:4> having different phases to synchronize with the external reference clock CKref, thereby outputting a signal indicating the current edge position information of the external reference clock CKref, the signal having a 2-bit value as indicated by Table 3 above.

The semiconductor device according to the aforementioned embodiments may be used in various electronic appliances or systems. FIG. 11 to FIG. 15 illustrate some examples of an electronic appliance or a system which may be implemented using the semiconductor device including the all digital phase locked loop according to the aforementioned embodiments.

Figure 11:
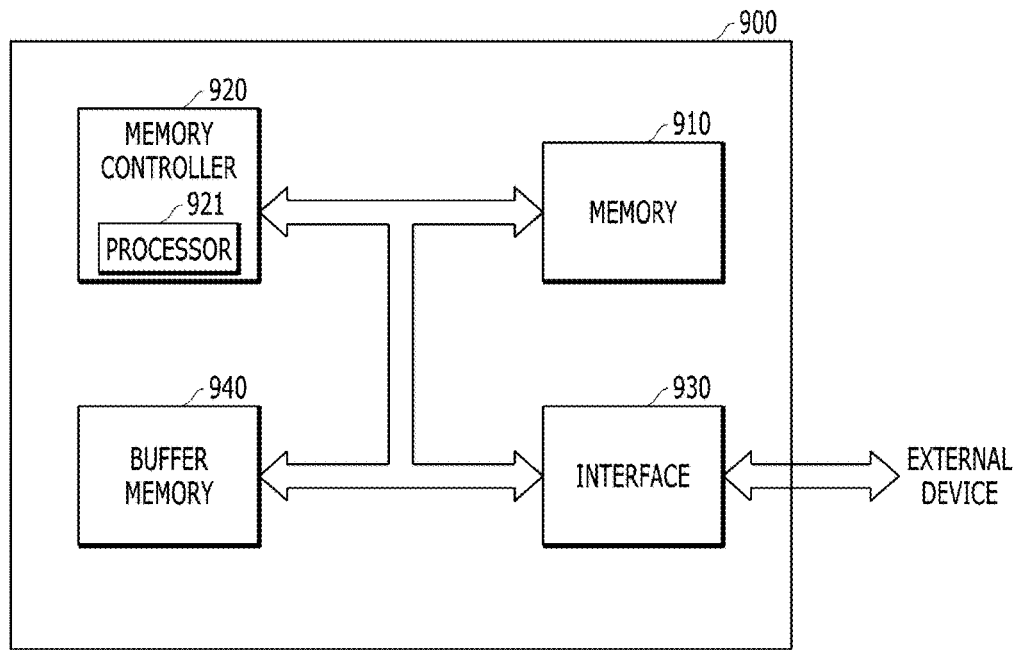
FIG. 11 is a diagram of a memory system for implementing a semiconductor device according to an embodiment.

FIG. 11 is one example of a configuration diagram of a memory system for implementing a semiconductor device according to an embodiment of the present disclosure.

Referring to FIG. 11, a memory system 900 may include a memory 910 having nonvolatile characteristics as a data storage element, a memory controller 920 for controlling the memory 910, an interface 930 for a connection with an external device, a buffer memory 940 for efficiently transferring data input/output between the interface 930 and the memory 910 with the multi-functionality and high performance of the interface with an external device, the memory controller 920, and the memory system, and the like. The memory system 900 may be prepared in the form of a card such as a solid state disk (SSD), a universal serial bus (USB) memory, a secure digital card (SD), a mini secure digital card (mSD), a micro secure digital card (micro SD), a secure digital high capacity (SDHC), a memory stick card, a smart media card (SM), a multi-media card (MMC), an embedded MMC (eMMC), and a compact flash (CF).

The memory 910 of the present embodiment may include a ROM (Read Only Memory), a NOR flash memory, a NAND flash memory, a PRAM (Phase Change Random Access Memory), an RRAM (Resistive Random Access Memory), a MRAM (Magnetic Random Access Memory) having nonvolatile characteristics, and the like.

The memory controller 920 may control data exchange between the memory 910 and the interface 930. To this end, the memory controller 920 may include a processor 921 for processing command words inputted from an exterior of the memory system 900 through the interface 930.

The interface 930 exchanges commands, data, and the like between the memory system 900 and an external device, and may be compatible with one or more interfaces having different types.

The buffer memory 940 for temporarily storing data may include one or more of the aforementioned embodiments of the semiconductor device. For example, the buffer memory 940 may include the all digital phase locked loop and the semiconductor device including the all digital phase locked loop.

For example, the all digital phase locked loop used in the semiconductor device may include the integer part phase processing units 120 and 820, the fraction part phase processing units 130 and 830, and the frequency adding units 140 and 840. The integer part phase processing unit outputs an integer part frequency signal by using a value obtained by counting a phase of any one of a plurality of output clocks, which are outputted from a digital control oscillator and have different phases, by using one rotational counter and converting the counted phase into a digital value, and a value obtained by allowing the plurality of output clocks to synchronize with an external reference clock and outputting current edge position information. The fraction part phase processing unit selects two adjacent output clocks of the plurality of output clocks by using a prediction selection signal generated by adding fraction part phase information of a frequency command word and the current edge position information to each other, and outputs a fraction part frequency signal by using fraction part phase information generated by time-digitally converting the two adjacent output clocks by using two time to digital converters. The frequency adding unit adds the integer part frequency signal to the fraction part frequency signal, and outputs a frequency read word corresponding to frequencies of the plurality of output clocks. Accordingly, it is possible to implement the buffer memory 940 with low power and to reduce unnecessary calculation of the buffer memory 940. Consequently, it is possible to improve the performance of the memory system 900.

In addition, the buffer memory 940 of the present embodiment may further include a SRAM (Static Random Access Memory) and a DRAM (Dynamic Random Access Memory), which have volatile characteristics, and a ROM (Read Only Memory), a NOR flash memory, a NAND flash memory, a PRAM (Phase Change Random Access Memory), an RRAM (Resistive Random Access Memory), a STTRAM (Spin Transfer Torque Memory), a MRAM (Magnetic Random Access Memory) and the like, which have nonvolatile characteristics.

Figure 12:
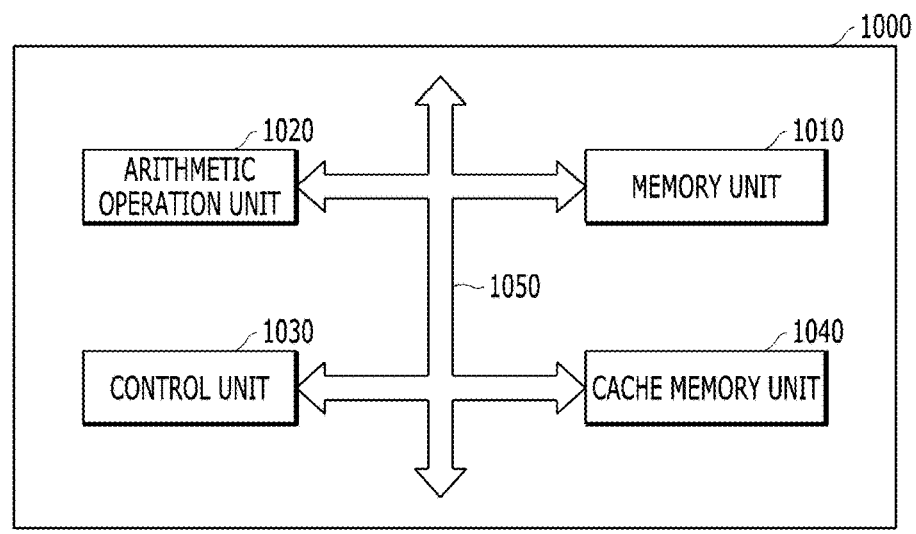
FIG. 12 is a diagram of a microprocessor for implementing a semiconductor device according to an embodiment.

FIG. 12 is one example of a configuration diagram of a microprocessor for implementing the semiconductor device according to an embodiment of the present disclosure.

Referring to FIG. 12, a microprocessor 1000 may control and adjust a series of processes of receiving data from various external devices, processing the data, and sending the processing result to the external devices, and include a memory unit 1010, an arithmetic operation unit 1020, a control unit 1030, a cache memory unit 1040, and the like. The microprocessor 1000 may be various data processing devices such as a central processing unit (CPU), a graphic processing unit (GPU), a digital signal processor (DSP), and an application processor (AP).

The memory unit 1010 may be a processor register, a register and the like, may be a part for storing data in the microprocessor 1000, may include a data register, an address register, a floating point register, and the like, and may include various other registers. The memory unit 1010 may temporarily store data for performing an arithmetic operation in the arithmetic operation unit 1020 and data obtained by performing the arithmetic operation, and an address storing the data for performing the arithmetic operation.

The arithmetic operation unit 1020 may perform various four fundamental arithmetic operations or logic operations according to a result obtained by decoding commands in the control unit 1030. The arithmetic operation unit 1020 may include one or more arithmetic and logic units (ALUs) and the like.

The control unit 1030 may receive signals from the memory unit 1010, the arithmetic operation unit 1020, an external device and the like of the microprocessor 1000, perform extraction or decoding of commands, control and the like of signal input/output of the microprocessor 1000, and perform processing represented by programs.

The cache memory unit 1040, which may temporarily store data to be inputted from or to be outputted to an external device, may include one or more of the aforementioned embodiments of the semiconductor device. For example, the cache memory unit 1040 may include the all digital phase locked loop and the semiconductor device including the all digital phase locked loop. Since the all digital phase locked loop has been described above, a description of the configuration and operation method thereof is omitted. Accordingly, it is possible to implement the cache memory unit 1040 with low power and to reduce unnecessary calculation. Consequently, it is possible to improve the performance of the microprocessor 1000. The cache memory unit 1040 may exchange data with the memory unit 1010, the arithmetic operation unit 1020, and the control unit 1030 through a bus interface 1050.

Figure 13:
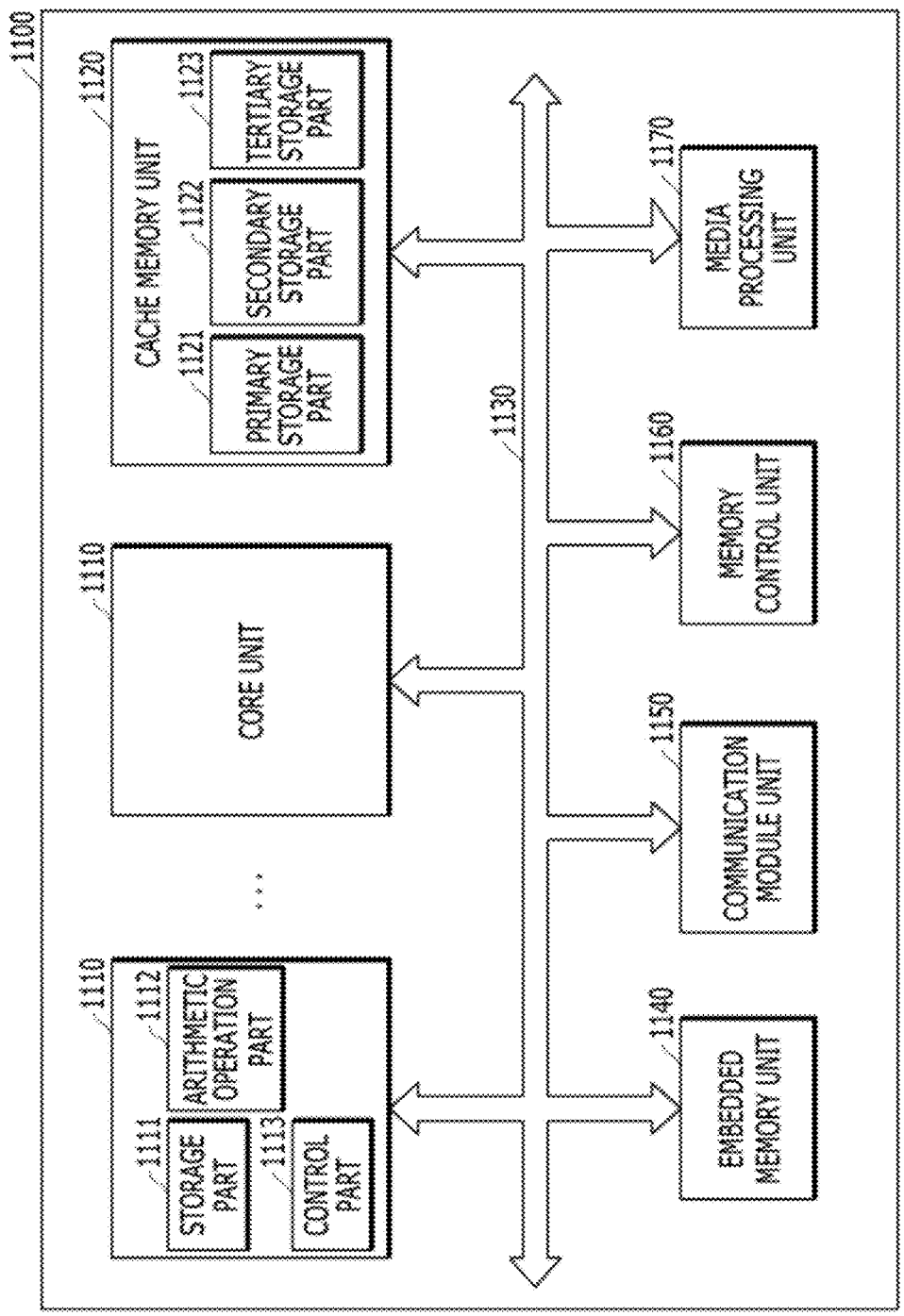
FIG. 13 is a diagram of a processor for implementing a semiconductor device according to an embodiment.

FIG. 13 is one example of a configuration diagram of a processor for implementing the semiconductor device according to an embodiment of the present disclosure.

Referring to FIG. 13, a processor 1100 may include various functions in addition to the function of the microprocessor that controls and adjusts a series of processes of receiving data from various external devices, processing the data, and sending the processing result to the external devices, thereby achieving performance improvement and multi-functionality. The processor 1100 may include a core unit 1110 serving as the microprocessor, a cache memory unit 1120 that temporarily stores data, and a bus interface 1130 for transferring data between an interior and the external devices. The processor 1100 may include various system on chips (SoCs) such as a multi-core processor, a graphic processing unit (GPU), and an application processor (AP).

The core unit 1110 may perform an arithmetic and logic operation on data inputted from an external device, and may include a storage part 1111, an arithmetic operation part 1112, and a control part 1113.

The storage part 1111 may be a processor register, a register and the like, may be a part for storing data in the processor 1100, may include a data register, an address register, a floating point register, and the like, and may include various other registers. The storage part 1111 may temporarily store data for performing an arithmetic operation in the arithmetic operation part 1112 and data obtained by performing the arithmetic operation, and an address storing the data for performing the arithmetic operation. The arithmetic operation part 1112 may be a part for performing arithmetic operations in the processor 1100, and may perform various four fundamental arithmetic operations or logic operations according to a result obtained by decoding commands in the control part 1113. The arithmetic operation part 1112 may include one or more arithmetic and logic units (ALUs) and the like. The control part 1113 may receive signals from the storage part 1111, the arithmetic operation part 1112, an external device and the like of the processor 1100, perform extraction or decoding of commands, control and the like of signal input/output of the processor 1100, and perform processing represented by programs.

The cache memory unit 1120 includes a primary storage part 1121, a secondary storage part 1122, and a tertiary storage part 1123 as parts for temporarily storing data in order to compensate for a data processing speed difference between the core unit 1110 operating at a high speed and an external device operating at a low speed. In general, the cache memory unit 1120 includes the primary and secondary storage parts 1121 and 1122, may include the tertiary storage part 1123 when high capacity is required, and include many more storage parts as necessary. That is, the number of storage parts included in the cache memory unit 1120 may be changed to design. The processing speeds of the primary, secondary, and tertiary storage parts 1121, 1122, and 1123 for storing and determining data may be equal to or different from one another. When the processing speeds of the storage parts are different from one another, the primary storage part may have the fastest speed. One or more of the primary storage part 1121, the secondary storage part 1122, and the tertiary storage part 1123 of the cache memory unit 1120 may include one or more of the aforementioned embodiments of the semiconductor device. For example, the cache memory unit 1120 may include the all digital phase locked loop and the semiconductor device including the all digital phase locked loop. Since the all digital phase locked loop has been described above, a description of the configuration and operation method thereof is omitted. Accordingly, it is possible to implement the cache memory unit 1120 with low power and to reduce unnecessary calculation. Consequently, it is possible to improve the performance of the processor 1100.

FIG. 13 illustrates the configuration in which all the primary, secondary, and tertiary storage part 1121, 1122, and 1123 are provided in the cache memory unit 1120; however, all the primary, secondary, and tertiary storage parts 1121, 1122, and 1123 of the cache memory unit 1120 may be provided outside the core unit 1110 to compensate for a processing speed difference between the core unit 1110 and an external device. Alternatively, the primary storage part 1121 of the cache memory unit 1120 may be positioned in the core unit 1110 and the secondary storage part 1122 and the tertiary storage part 1123 may be provided outside the core unit 1110, so that the compensation function of the processing speed difference may be further enhanced. Alternatively, the primary and secondary storage parts 1121 and 1122 may be positioned in the core unit 1110 and the tertiary storage part 1123 may be provided outside the core unit 1110.

The bus interface 1130 may connect the core unit 1110, the cache memory unit 1120, and an external device to one another, thereby efficiently transmitting data.

The processor 1100 according to the present embodiment may include a plurality of core units 1110, wherein the plurality of core units 1110 may share the cache memory unit 1120. The plurality of core units 1110 and the cache memory unit 1120 may be directly and electrically coupled to each other, or may be electrically coupled to each other through the bus interface 1130. The plurality of core units 1110 may have the same configuration as that of the aforementioned core unit. When the processor 1100 includes the plurality of core units 1110, the primary storage part 1121 of the cache memory unit 1120 may be configured in the respective core units 1110 in correspondence with the number of the plurality of core units 1110, and the secondary storage part 1122 and the tertiary storage part 1123 may be configured outside the plurality of core units 1110 so as to be shared through the bus interface 1130. In this case, the processing speed of the primary storage part 1121 may be faster than the processing speeds of the secondary and tertiary storage parts 1122 and 1123. In another embodiment, the primary storage part 1121 and the secondary storage part 1122 may be configured in the respective core units 1110 in correspondence with the number of the plurality of core units 1110, and the tertiary storage part 1123 may be configured outside the plurality of core units 1110 so as to be shared through the bus interface 1130.

The processor 1100 according to the present embodiment may additionally include an embedded memory unit 1140 for storing data, a communication module unit 1150 capable of transmitting/receiving data to/from an external device in a wired or wireless manner, a memory control unit 1160 for driving an external memory unit, a media processing unit 1170 for processing data processed in the processor 1100 or data inputted from an external input device and outputting the processed data to an external interface device, and the like, and may include a plurality of modules and devices in addition to them. In this case, the plurality of added modules may exchange data with the core unit 1110 and the cache memory unit 1120 through the bus interface 1130.

The embedded memory unit 1140 may include a nonvolatile memory as well as the aforementioned volatile memory.

The communication module unit 1150 may include a module connectable to a wired network, a module connectable to a wireless network, and all these modules. The wired network module may include a local area network (LAN), a universal serial bus (USB), an Ethernet, a power line communication (PLC) and the like as with various devices for transmitting/receiving data through a transmission line. The wireless network module may include infrared data association (IrDA), code division multiple access (CDMA), time division multiple access (TDMA), frequency division multiple access (FDMA), a wireless LAN, a zigbee, a ubiquitous sensor network (USN), Bluetooth, RFID (Radio Frequency IDentification), long term evolution (LTE), near field communication (NFC), wireless broadband Internet (Wibro), high speed downlink packet access (HSDPA), wideband CDMA (WCDMA), ultra wideband (UWB) and the like as with various devices for transmitting/receiving data without a transmission line.

The memory control unit 1160 processes and manages data exchanged with external storage devices operating according to different communication standards, and may include various memory controllers, for example, a control for controlling IDE (Integrated Device Electronics), SATA (Serial Advanced Technology Attachment), SCSI (Small Computer System Interface), RAID (Redundant Array of Independent Disks), SSD (Solid State Disk), eSATA (External SATA), PCMCIA (Personal Computer Memory Card International Association), a universal serial bus (USB), a secure digital card (SD), a mini secure digital card (mSD), a micro secure digital card (micro SD), a secure digital high capacity (SDHC), a memory stick card, a smart media card (SM), a multi-media card (MMC), an embedded MMC (eMMC), and a compact flash card (CF) and the like.

The media processing unit 1170 may process data processed in the processor 1100, or a video, sound, and other types of data inputted from an external input device, and output the data to an external interface device. The media processing unit 1170 may include a graphic processing unit (GPU), a digital signal processor (DSP), a high definition audio (HD Audio), a high definition multimedia interface (HDMI) controller and the like.

Figure 14:
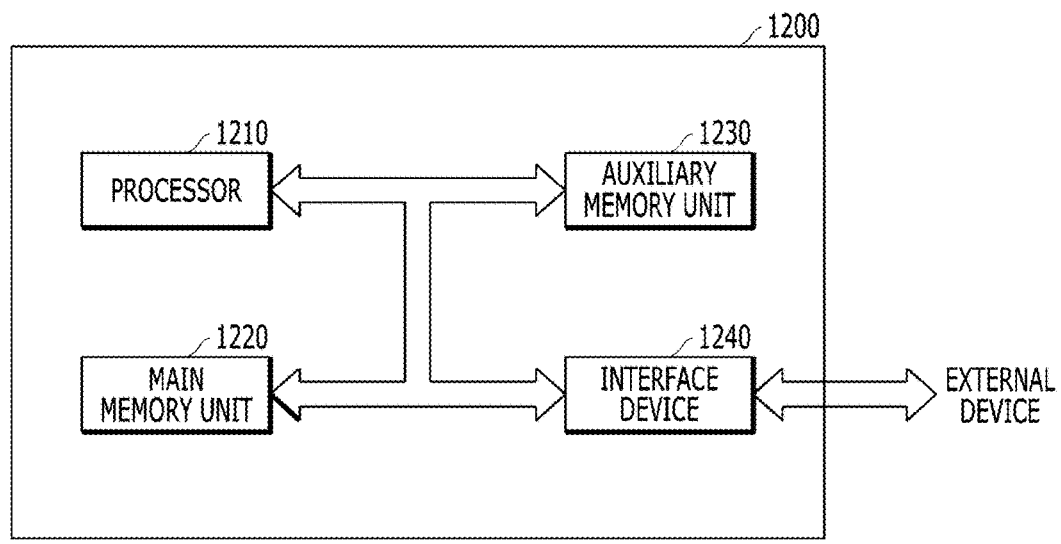
FIG. 14 is a diagram of a system for implementing a semiconductor device according to an embodiment of the present invention.

FIG. 14 is one example of a configuration diagram of a system for implementing the semiconductor device according to an embodiment of the present disclosure.

Referring to FIG. 14, a system 1200 is a data processing device and may perform input, processing, output, communication, storage and the like in order to perform a series of operations on the data. The system 1200 may include a processor 1210, a main memory unit 1220, an auxiliary memory unit 1230, an interface device 1240 and the like. The system 1200 of the present embodiment may be various electronic systems, which operate by using a process, such as a computer, a server, a PDA (Personal Digital Assistant), a portable computer, a web tablet, a wireless phone, a mobile phone, a smart phone, a digital music player, a PMP (Portable Multimedia Player), a camera, a global positioning system (GPS), a video camera, a voice recorder, a telematics, an AV (Audio Visual) system, and a smart television.

The processor 1210 may control processing of interpretation of inputted commands and arithmetic operation, comparison and the like of materials stored in the system 1200, and may include a microprocessor unit (MPU), a central processing unit (CPU), a single multi-core processor, a graphic processing unit (GPU), an application processor (AP), a digital signal processor (DSP) and the like.

The main memory unit 1220 is a memory space capable of moving programs codes and materials from the auxiliary memory unit 1230 and storing/executing the programs codes and the materials when a program is executed, and may include a volatile memory type of static random access memory (SRAM), dynamic random access memory (DRAM) and the like in which all content is erased when power is off. The main memory unit 1220 may include one or more of the aforementioned embodiments of the semiconductor device. For example, the main memory unit 1220 may include the all digital phase locked loop and the semiconductor device including the all digital phase locked loop. Since the all digital phase locked loop has been described above, a description of the configuration and operation method thereof is omitted. Accordingly, it is possible to implement the main memory unit 1220 with low power and to reduce unnecessary calculation. Consequently, it is possible to achieve low power consumption of the system 1200, thereby improving the performance of the system 1200.

The auxiliary memory unit 1230 indicates a memory unit for storing program codes and data. The auxiliary memory unit 1230 has a speed slower than that of the main memory unit 1220 and may store many materials. The auxiliary memory unit 1230 may include one or more of the aforementioned embodiments of the semiconductor device. The auxiliary memory unit 1230 may further include a data storage system (see 1300 of FIG. 15) such as a magnetic tape and a magnetic disc using magnetism, a laser disc using light, a magneto-optical disc using magnetism and light, a solid state disk (SSD), a universal serial bus (USB) memory, a secure digital card (SD), a mini secure digital card (mSD), a micro secure digital card (micro SD), a secure digital high capacity (SDHC), a memory stick card, a smart media card (SM), a multi-media card (MMC), an embedded MMC (eMMC), and a compact flash card (CF).

The interface device 1240 may exchange commands, data and the like between the system 1200 of the present embodiment and an external device, and may be a keypad, a keyboard, a mouse, a speaker, a microphone, a display, various human interface devices (HIDs), communication devices and the like. The communication device may include a module connectable to a wired network, a module connectable to a wireless network, and all these modules.

The wired network module may include a local area network (LAN), a universal serial bus (USB), an Ethernet, a power line communication (PLC) and the like as with various devices for transmitting/receiving data through a transmission line. The wireless network module may include infrared data association (IrDA), code division multiple access (CDMA), time division multiple access (TDMA), frequency division multiple access (FDMA), a wireless LAN, a zigbee, a ubiquitous sensor network (USN), Bluetooth, RFID (Radio Frequency IDentification), long term evolution (LTE), near field communication (NFC), wireless broadband Internet (Wibro), high speed downlink packet access (HSDPA), wideband CDMA (WCDMA), ultra wideband (UWB) and the like as with various devices for transmitting/receiving data without a transmission line.

Figure 15:
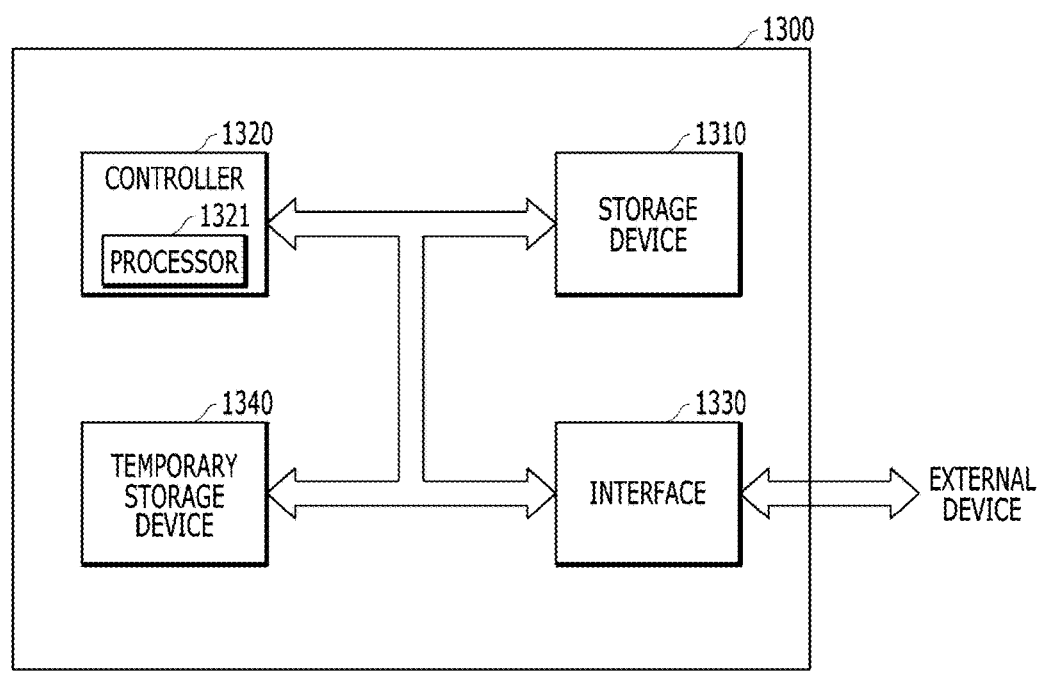
FIG. 15 is a diagram of a data storage system for implementing a semiconductor device according to an embodiment.

FIG. 15 is one example of a configuration diagram of a data storage system for implementing the semiconductor device according to an embodiment of the present disclosure.

Referring to FIG. 15, a data storage system 1300 is a configuration for data storage, and may include a storage device 1310 having nonvolatile characteristics, a controller 1320 for controlling the storage device 1310, an interface 1330 for a connection to an external device, and a temporary storage device 1340 for temporarily storing data. The data storage system 1300 may be prepared in the form of a disc such as a hard disk drive (HDD), an optical drive (compact disc read only memory; CDROM), a DVD (Digital Versatile Disc), and a solid state disk (SSD), and the aforementioned various types of cards.

The storage device 1310 may include a nonvolatile memory that stores data semipermanently. Since the nonvolatile memory has been described above, a description thereof is omitted.

The controller 1320 may control data exchange between the storage device 1310 and the interface 1330. To this end, the controller 1320 may include a processor 1321 that performs an arithmetic operation and the like for processing commands inputted from an exterior of the data storage system 1300 through the interface 1330.

The interface 1330 exchanges commands, data and the like between the data storage system 1300 and an external device. When the data storage system 1300 is a card, the interface 1330 may be compatible with interfaces used in devices prepared in the aforementioned various forms, or may be compatible with interfaces used in devices similar to these devices. When the data storage system 1300 is a disc type, the interface 1330 may be compatible with interfaces such as IDE (Integrated Device Electronics), SATA (Serial Advanced Technology Attachment), SCSI (Small Computer System Interface), eSATA (External SATA), PCMCIA (Personal Computer Memory Card International Association), and a universal serial bus (USB), or may be compatible with interfaces similar to these interfaces. The interface 1330 may be compatible with one or more interfaces having different types.

The temporary storage device 1340 may temporarily store data in order to efficiently transfer data between the interface 1330 and the storage device 1310 with the multi-functionality and high performance of the interface with an external device, the controller, and the system. The temporary storage device 1340 may include one or more of the aforementioned embodiments of the semiconductor device. For example, the temporary storage device 1340 may include the all digital phase locked loop and the semiconductor device including the all digital phase locked loop. Since the all digital phase locked loop has been described above, a description of the configuration and operation method thereof is omitted. Accordingly, it is possible to implement the temporary storage device 1340 with low power and to reduce unnecessary calculation. Consequently, it is possible to achieve low power consumption of the data storage system 1300.

Although various embodiments have been described for illustrative purposes, it will be apparent to those skilled in the art that various changes and modifications may be made without departing from the spirit and scope of the invention as defined in the following claims.

Figure 16:
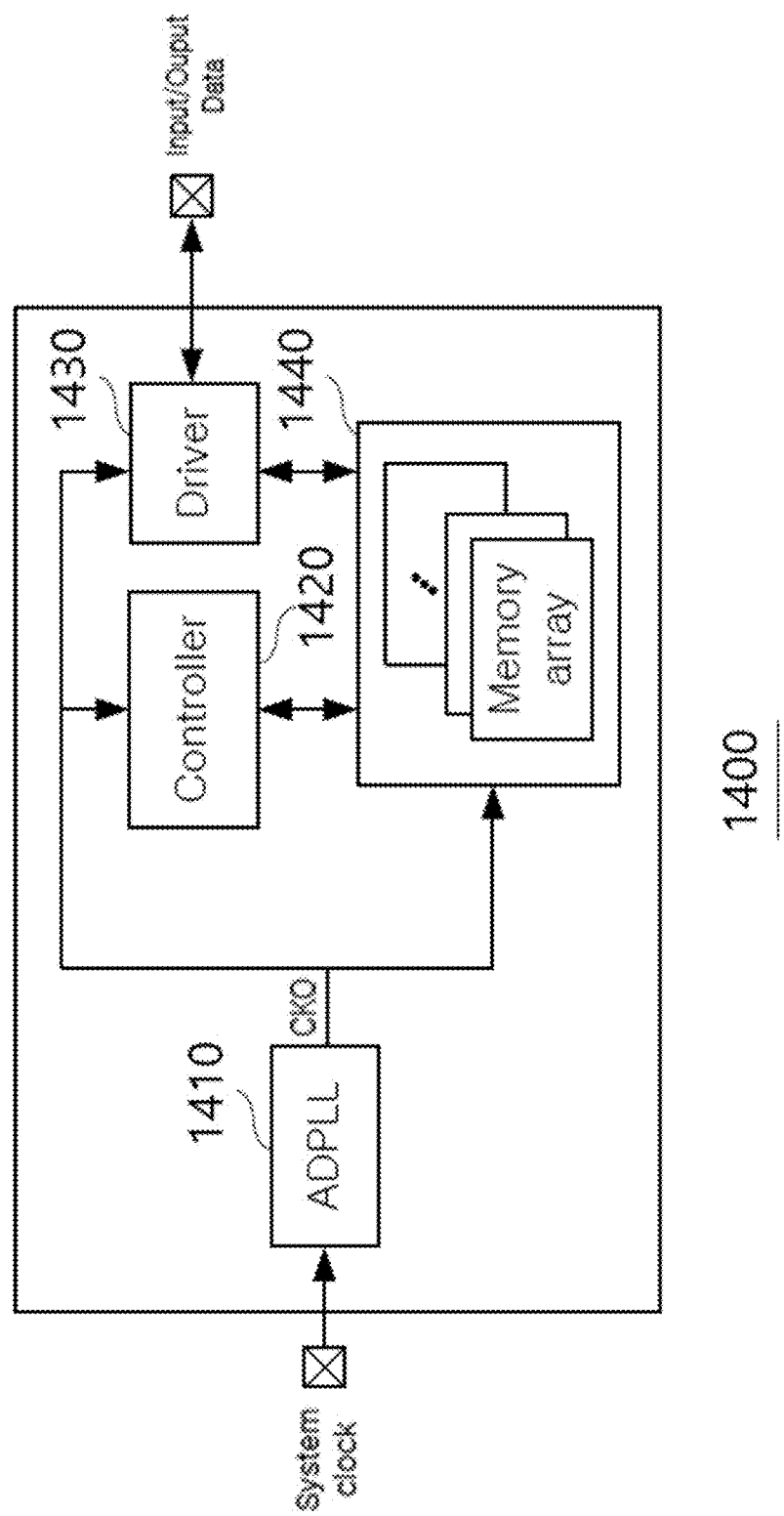
FIG. 16 is a block diagram that illustrates a DRAM including an ADPLL according to an embodiment.

FIG. 16 illustrates a block diagram of an exemplary dynamic random access memory (DRAM) device 1400 utilizing an all digital phase locked loop (ADPLL) circuit 1410 in accordance with an embodiment of the present disclosure. The ADPLL circuit 1410 outputs one or more output clock signals CKO to a controller 1420, a driver 1430, and multiple memory arrays 1440 in the DRAM device 1400.

What is claimed is:
1. An all digital phase locked loop (ADPLL) comprising:
a digitally-controlled oscillator (DCO) outputting a plurality of output clock signals, the plurality of output clock signals having different phases with respect to each other;
an integer part phase processing circuit outputting an integer part frequency signal by using a first value and a second value, the first value being obtained by counting edges of one of the plurality of output clock signals, and the second value indicating current edge position information on an edge position of an external reference clock signal with respect to the plurality of output clock signals;
a fraction part phase processing circuit selecting two adjacent output clocks of the plurality of output clock signals according to a prediction selection signal, the prediction selection signal being generated according to a fraction part phase signal indicating fraction part phase information of the external reference clock signal and a signal indicating the current edge position information, the fraction part phase processing circuit converting the two adjacent output clock signals into respective digital signals to generate the fraction part phase signal, and generating a fraction part frequency signal using the fraction part phase signal; and
a frequency adding circuit adding the integer part frequency signal to the fraction part frequency signal, and outputting a frequency real word indicating frequencies of the plurality of output clock signals.

2. The all digital phase locked loop according to claim 1, wherein the integer part phase processing circuit comprises:
a counter counting a number of rising edges of the one of the plurality of output clocks and outputting a digital count signal in synchronization with an internal reference clock signal, the digital count signal indicating the first value;
a differentiator differentiating the digital count signal and outputting a digital count deviation signal;
a multiplier multiplying a value of the digital count deviation signal by a predetermined factor and outputting a digital count deviation multiplication signal;
a retiming circuit causing the plurality of output clock signals to synchronize with the external reference clock signal to generate a plurality of retiming clock signals;
an edge detector outputting the signal indicating the current edge position information using the plurality of retiming clock signals;
a temporary storage circuit temporarily storing the current edge position information and outputting a signal indicating immediately previous edge position information in synchronization with the internal reference clock signal;
an adder adding a value of the digital count deviation multiplication signal to the second value indicating the current edge position information and outputting a current edge position correction signal; and
a subtractor subtracting a value of the signal indicating the immediately previous edge position information from a value of the current edge position correction signal and outputting the integer part frequency signal.

3. The all digital phase locked loop according to claim 1, wherein the fraction part phase processing circuit comprises:
a first adder adding the fraction part phase signal, a signal indicating a portion of a frequency command word, and the signal indicating the current edge position information, and outputting a selection signal;
a temporary storage circuit temporarily storing the selection signal as the prediction selection signal and outputting an immediately previous prediction selection signal;
a multiplexer selecting the two adjacent output clock signals using the immediately previous prediction selection signal;
a first time to digital converter (TDC) causing a first output clock signal of the two adjacent output clock signals to synchronize with a plurality of delayed reference frequency clock signals to output a first signal indicating phase information of the first output clock signal, the plurality of delayed reference frequency clock signals obtained by delaying a reference frequency clock signal by a plurality delay amounts respectively;
a second TDC causing a second output clock signal of the two adjacent output clocks to synchronize with the plurality of delayed reference frequency clocks, to output a second signal indicating phase information of the second output clock signal;
a second adder adding a predetermined offset value, a value of the first signal indicating the phase information of the first output clock signal, and a value of the second signal indicating the phase information of the second output clock signal to output the fraction part phase signal; and a differentiator differentiating the fraction part phase signal and outputting the fraction part frequency signal.

4. The all digital phase locked loop according to claim 1, wherein the frequency adding circuit comprises:

an adder adding the integer part frequency signal to the fraction part frequency signal and outputting an added frequency signal; and a frequency averaging circuit dividing a value of the added frequency signal by a number of the plurality of output clock signals and outputting the frequency real word.

5. The all digital phase locked loop according to claim 1, wherein the integer part phase processing circuit comprises:

a counter counting a number of rising edges of the one of the plurality of output clock signals and outputting a digital count signal in synchronization with an internal reference clock, the digital count signal indicating the first value;

a differentiator differentiating the digital count signal and outputting a digital count deviation signal;

a multiplier multiplying a value of the digital count deviation signal by a predetermined factor and outputting a digital count deviation multiplication signal;

a flip-flop causing one of the plurality of output clock signals to synchronize with the external reference clock;

an edge detector outputting the signal indicating the current edge position information by causing the plurality of output clock signals to synchronize with the external reference clock;

a temporary storage circuit temporarily storing the current edge position information and outputting a signal indicating immediately previous edge position information in synchronization with the internal reference clock;

an adder adding a value of the digital count deviation multiplication signal to the second value indicating the current edge position information and outputting a current edge position correction signal; and a subtractor subtracting a value of the signal indicating the immediately previous edge position information from a value of the current edge position correction signal and outputting the integer part frequency signal.

6. The all digital phase locked loop according to claim 1, further comprising:

a reference frequency delay circuit including a plurality of delay elements serially and electrically coupled to each other, wherein the plurality of delay elements respectively output a plurality of delayed reference frequency clock signals using a reference frequency clock signal applied from an external device, one of the plurality of delayed reference frequency clocks being the external reference clock signal.

7. An all digital phase locked loop (ADPLL) comprising:

a first subtractor subtracting a frequency real word from a frequency command word and outputting a frequency deviation signal;

an integrator integrating the frequency deviation signal and outputting a phase deviation signal;

a modulator modulating the phase deviation signal and outputting a digitally-controlled oscillator (DCO) driving signal;

a DCO generating a plurality of output clock signals having different phases in response to the DCO driving signal;

an integer part phase processing circuit outputting an integer part frequency signal by using a first value and a second value, the first value being obtained by counting edges of one of the plurality of output clock signals, and the second value indicating current edge position information on an edge position of an external reference clock signal with respect to the plurality of output clock signals;

a fraction part phase processing circuit selecting two adjacent output clock signals of the plurality of output clock signals using a prediction selection signal, the prediction selection signal being generated according to a fraction part phase signal indicating fraction part phase information of the external reference clock signal and a signal indicating the current edge position information, the fraction part phase processing circuit converting the two adjacent output clock signals into respective digital signals to generate the fraction part phase signal, and generating the fraction part frequency signal using the fraction part phase information signal; and a frequency adding circuit adding the integer part frequency signal to the fraction part frequency signal, and outputting the frequency read word indicating frequencies of the plurality of output clock signals.

8. The all digital phase locked loop according to claim 7, wherein the integer part phase processing circuit comprises:

a counter counting a number of rising edges of the one of the plurality of output clocks and outputting a digital count signal in synchronization with an internal reference clock signal, the digital count signal indicating the first value;

a differentiator differentiating the digital count signal and outputting a digital count deviation signal;

a multiplier multiplying a value of the digital count deviation signal by a predetermined factor and outputs a digital count deviation multiplication signal;

a retiming circuit causing the plurality of output clocks to synchronize with the external reference clock signal to generate a plurality of retiming clock signals;

an edge detector outputting the signal indicating the current edge position information using the plurality of retiming clock signals;

a temporary storage circuit temporarily storing the current edge position information and outputting a signal indicating immediately previous edge position information in synchronization with the internal reference clock signal;

an adder adding a value of the digital count deviation multiplication signal to the second value indicating the current edge position information and outputting a current edge position correction signal; and a subtractor subtracting a value of the signal indicating the immediately previous edge position information from a value of the current edge position correction signal and outputting a the integer part frequency signal.

9. The all digital phase locked loop according to claim 7, wherein the fraction part phase processing circuit comprises:

a first adder adding the fraction part phase signal, a signal indicating a portion of the frequency command word, and the signal indicating the current edge position information, and outputting a selection signal;

a temporary storage circuit temporarily storing the selection signal as the prediction selection signal and outputting an immediately previous prediction selection signal;
a multiplexer selecting and outputting the two adjacent output clock signals using the immediately previous prediction selection signal;
a first time to digital converter (TDC) causing a first output clock signal of the two adjacent output clock signals to synchronize with a plurality of delayed reference frequency clock signals to output a first signal indicating phase information of the first output clock signal, the plurality of delayed reference frequency clock signals obtained by delaying a reference frequency clock signal by a plurality delay amounts respectively;
a second TDC causing a second output clock signal of the two adjacent output clocks to synchronize with the plurality of delayed reference frequency clocks to output a second signal indicating phase information of the second output clock signal;
a second adder adding a predetermined offset value, a value of the first signal indicating the phase information of the first output clock signal, and a value of the second signal indicating the phase information of the second output clock signal to output the fraction part phase signal; and
a differentiator differentiating the fraction part phase signal and outputting the fraction part frequency signal.

10. The all digital phase locked loop according to claim 7, wherein the frequency circuit comprises:
an adder adding the integer part frequency signal to the fraction part frequency signal and outputting an added frequency signal; and
a frequency averaging circuit dividing a value of the added frequency signal by a number of the plurality of output clock signals and outputting the frequency real word.

11. The all digital phase locked loop according to claim 7, wherein the integer part phase processing circuit comprises:

a counter counting a number of rising edges of the one of the plurality of output clock signals and outputting a digital count signal in synchronization with an internal reference clock, the digital count signal indicating the first value;
a differentiator differentiating the digital count signal and outputting a digital count deviation signal;
a multiplier multiplying the digital count deviation signal by a predetermined factor and outputting a digital count deviation multiplication signal;
a flip-flop causing one of the plurality of output clock signals to synchronize with an external reference clock;
an edge detector outputting the signal indicating the current edge position information by causing the plurality of output clock signals to synchronize with the external reference clock;
a temporary storage circuit temporarily storing the current edge position information and outputting a signal indicating immediately previous edge position information in synchronization with the internal reference clock;
an adder adding a value of the digital count deviation multiplication signal to the second value indicating the current edge position information and outputting a current edge position correction signal; and
a subtractor subtracting a value of the signal indicating the immediately previous edge position information from a value of the current edge position correction signal and outputting the integer part frequency signal.

12. The all digital phase locked loop according to claim 7, further comprising:
a reference frequency delay circuit including a plurality of delay elements serially and electrically coupled to each other,
wherein the plurality of delay elements respectively output first to eighth delayed reference frequency clock signals using a reference frequency clock signal applied from an external device, one of the plurality of reference frequency clocks being the external reference clock signal.

* * * * *